United States Patent
Peng et al.

(10) Patent No.: US 11,222,662 B2
(45) Date of Patent: Jan. 11, 2022

(54) DIRECTLY PRINTABLE IMAGE RECORDING MATERIAL AND PREPARATION METHOD THEREOF

(71) Applicant: Huazhong University of Science and Technology, Hubei (CN)

(72) Inventors: Haiyan Peng, Hubei (CN); Guannan Chen, Hubei (CN); Xingping Zhou, Hubei (CN); Xiaolin Xie, Hubei (CN); Yonggui Liao, Hubei (CN); Hongwei Ge, Hubei (CN); Zhifang Yang, Hubei (CN); Xiaomei Zhang, Hubei (CN)

(73) Assignee: Huazhong University of Science and Technology, Hubei (CN)

( * ) Notice: Subject to any disclaimer, the term of this patent is extended or adjusted under 35 U.S.C. 154(b) by 574 days.

(21) Appl. No.: 16/308,637

(22) PCT Filed: May 25, 2018

(86) PCT No.: PCT/CN2018/088313
§ 371 (c)(1),
(2) Date: Dec. 10, 2018

(87) PCT Pub. No.: WO2019/041907
PCT Pub. Date: Mar. 7, 2019

(65) Prior Publication Data
US 2021/0183407 A1 Jun. 17, 2021

(30) Foreign Application Priority Data
Aug. 30, 2017 (CN) .......................... 201710765386.9

(51) Int. Cl.
*G11B 7/0065* (2006.01)
*C08F 2/38* (2006.01)
(Continued)

(52) U.S. Cl.
CPC .............. *G11B 7/0065* (2013.01); *C08F 2/38* (2013.01); *C08F 2/50* (2013.01); *C08F 290/06* (2013.01);
(Continued)

(58) Field of Classification Search
CPC . G11B 7/0065; C08F 2/38; C08F 2/50; C08F 290/06; C08G 77/04; G03H 1/04;
(Continued)

(56) References Cited

U.S. PATENT DOCUMENTS

2006/0194120 A1   8/2006  Cole et al.
2011/0027697 A1*  2/2011  Peredereeva ....... C08F 290/067
                                                          430/2

FOREIGN PATENT DOCUMENTS

CN          1514845 A    7/2004
CN        107544207 A    1/2018
(Continued)

OTHER PUBLICATIONS

Ni et al.; "3D Image Storage in Photopolymer/ZnS Nanocomposites Tailored by 'Photoinitibitor'", Macromolecules, Apr. 27, 2015, 48 (9), pp. 2958-2966, 9 pages.
(Continued)

*Primary Examiner* — Justin V Lewis
(74) *Attorney, Agent, or Firm* — Hamre, Schumann, Mueller & Larson, P.C.

(57) ABSTRACT

The present invention belongs to the field of functional materials, and particularly relates to a directly printable image recording material, a preparation method and application thereof. The image recording material comprises 25 to 78.8 parts by mass of a photopolymerizable monomer, 0.2 to 5 parts by mass of a photoinitiator, 20 to 70 parts by mass of an inert component, and 0.05 to 2 parts by mass of a thermal polymerization inhibitor, and has an initial viscosity
(Continued)

of 200 to 800 mPa·s. The photopolymerizable monomer includes a thiol monomer and an olefin monomer, at least one of which is a silicon-based monomer with polyhedral oligomeric silsesquioxane as a silicon core. By introducing a POSS-based thiol or olefin monomer into the photopolymerizable monomer in combination with other material components, the recording material is allowed to have an initial viscosity of 200 to 800 mPa·s, and meanwhile, the low thermal conductivity characteristic of the POSS-based photopolymerizable monomer is utilized, so that image storage quality is ensured, continuous industrial production of the image recording material is achieved, the process cost is reduced and the production efficiency is improved.

13 Claims, 1 Drawing Sheet

(51) Int. Cl.
    *C08F 2/50*     (2006.01)
    *C08F 290/06*     (2006.01)
    *G03H 1/04*     (2006.01)
    *C08G 77/04*     (2006.01)
    *G03H 1/18*     (2006.01)
    *G03H 1/02*     (2006.01)

(52) U.S. Cl.
    CPC ......... *C08G 77/045* (2013.01); *G03H 1/0402* (2013.01); *G03H 1/18* (2013.01); *G03H 2001/0264* (2013.01); *G03H 2001/0441* (2013.01); *G03H 2001/185* (2013.01); *G03H 2222/45* (2013.01); *G03H 2240/54* (2013.01); *G03H 2260/12* (2013.01); *G03H 2270/14* (2013.01); *G03H 2270/31* (2013.01)

(58) Field of Classification Search
    CPC .. G03H 1/18; G03H 1/02; B41M 3/06; B41M 3/14; B41M 5/52
    USPC .......... 101/483, 491; 106/31.13; 283/67, 72, 283/94, 98
    See application file for complete search history.

(56) References Cited

FOREIGN PATENT DOCUMENTS

| CN | 107599661 A | 1/2018 |
|---|---|---|
| CN | 107603642 A | 1/2018 |

OTHER PUBLICATIONS

Peng et al.; "High Performance Graded Rainbow Holograms via Two-Stage Sequential Orthogonal Thiol-Click Chemistry", Macromolecules, Mar. 28, 2014, 47 (7), pp. 2306-2315.

* cited by examiner

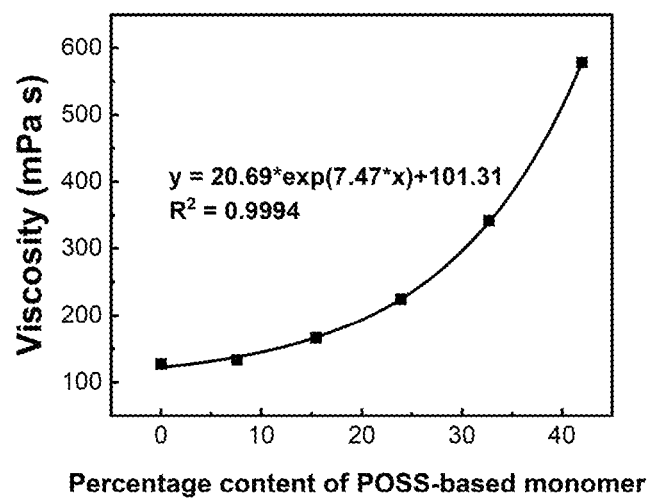

DIRECTLY PRINTABLE IMAGE RECORDING MATERIAL AND PREPARATION METHOD THEREOF

BACKGROUND OF THE INVENTION

Technical Field

The present invention belongs to the field of functional materials, and particularly relates to a directly printable image recording material, a preparation method and application thereof.

Description of the Related Art

Since the laser holographic image stores both the phase information and the amplitude information of the coherent light, the naked-eye 3D color image can be stored and read on the 2D plane, and thus, the laser holographic image is widely used in 3D display, telepresence, data storage, laser modulation, high-end anti-counterfeiting and other fields. The key to realizing holographic 3D image storage is the image recording material. Generally, before the holographic image is stored, the polymer and other functional components are uniformly mixed by a solvent, coated and dried, and finally subjected to laser holographic processing so as to achieve image storage. However, this method is complicated in process, wastes a large amount of solvent, and causes environmental pollution. Another method is to firstly form a gel network containing active monomers by polymerization [*Macromolecules* 2014, 47(7): 2306-2315], and then form an image by holographic illumination. In this method, the materials are difficult to store for a long time and the transport condition is high. A third method is relatively simple, in which the active monomer and the inert component are uniformly mixed, filled into a mold, and then store images by holographic illumination. In this method, the materials need to be packaged in a glass case, which obviously increases the processing cost, and thus, this method is difficult to apply to continuous industrial production.

In order to achieve holographic industrial application, it is crucial to develop a material that is applicable to a continuous industrial production mode. Holographic continuous industrial production requires direct coating of the material onto a plastic substrate or glass substrate with good light transmission, as well as holographic exposure to record an image. This method requires that the material is capable of be printed directly, and usually has a viscosity of 200 to 800 mPa·s. However, according to the Einstein-Stokes equation, increasing the viscosity of the material tends to reduce the diffusion rate of molecules and particles in the system, resulting in poor storage quality of the holographic image, even impossible to record [*Macromolecules* 2015, 48(9): 2958-2966]. This contradiction limits the development of printable holographic image materials, thereby limiting the holographic industrial application.

SUMMARY OF THE INVENTION

In view of the above-described defects or improvement requirements in the art, the present invention provides a directly printable image recording material and a preparation method, the purpose of which is that by introducing a silicon-based monomer with polyhedral oligomeric silsesquioxane as the silicon core into the photopolymerizable monomer in combination with other material components, the recording material is allowed to have an initial viscosity of 200 to 800 mPa·s, and meanwhile, the low thermal conductivity characteristic of the silicon-based monomer with polyhedral oligomeric silsesquioxane as the silicon core is utilized to enable internal heat generated during the reaction to promote the diffusion of the inert component, so that image storage quality is ensured, continuous industrial production of the image recording material is achieved, the process cost is reduced and the production efficiency is improved. Thus, the technical problem that continuous industrial production cannot be achieved or increasing the viscosity leads to poor image storage quality in the prior art is solved.

In order to achieve the above objective, according to an aspect of the present invention, there is provided a directly printable image recording material, characterized by comprising 25 to 78.8 parts by mass of a photopolymerizable monomer, 0.2 to 5 parts by mass of a photoinitiator, 20 to 70 parts by mass of an inert component, and 0.05 to 2 parts by mass of a thermal polymerization inhibitor, the image recording material having an initial viscosity of 200 to 800 mPa·s, wherein: the photopolymerizable monomer includes a thiol monomer and an olefin monomer, a molar ratio of the thiol functional group to the olefin functional group in the photopolymerizable monomer is 1:10 to 10:1, at least one of the thiol monomer and the olefin monomer is a silicon-based monomer with polyhedral oligomeric silsesquioxane as a silicon core, and the silicon-based monomer in the photopolymerizable monomer has a mole percentage of not less than 10%.

Preferably, a molar ratio of the thiol functional group to the olefin functional group in the photopolymerizable monomer is 1:5 to 5:1.

Further preferably, a molar ratio of the thiol functional group to the olefin functional group in the photopolymerizable monomer is 1:3 to 3:1.

Preferably, the silicon-based monomer has a structure as shown in formula (1):

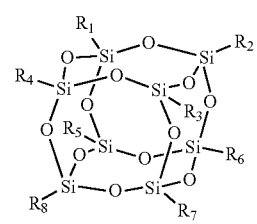

Formula (1)

when the thiol monomer is a silicon-based thiol monomer shown in the formula (1), its outer organic functional groups $R_1, R_2 \ldots R_8$ are each independently $C_aH_{2a+1}$ or $C_bH_{2b}SH$, and at least one organic functional group is $C_bH_{2b}SH$, where a represents an integer of 0 to 9, and b represents an integer of 1 to 9;

when the olefin monomer is a silicon-based olefin monomer shown in the formula (1), its outer organic functional groups $R_1, R_2 \ldots R_8$ are each independently $C_cH_{2c+1}$ or $C_dH_{2d}—C_2H_4$, and at least one organic functional group is $C_dH_{2d}—C_2H_4$, where c represents an integer of 0 to 9, and d represents an integer of 1 to 7.

Preferably, when the thiol monomer is not a silicon-based monomer, it is one or more of ethylene glycol di(3-mercaptopropionate), trimethylolpropane tris(3-mercaptopropionate) and pentaerythritol tetrakis(3-mercaptopropionate).

Preferably, when the olefin monomer is not a silicon-based monomer, it is one or more of trimethylolpropane triacrylate, pentaerythritol tetraacrylate, pentaerythritol triacrylate, hyperbranched acrylate 6361-100, triallyl isocyanurate, pentaerythritol triallyl ether, divinyl sulfone, tetravinylsilane, tetraallyl silane, 2,4,6-trivinyl-2,4,6-trimethylcyclotrisiloxane, and tetramethyltetravinylcyclotetrasiloxane.

Preferably, the photoinitiator is one or more of rose bengal/N-phenylglycine, (2,4,6-trimethoxyphenyl)diphenylphosphine oxide, Irgacure 184/dibenzoyl peroxide, Irgacure 784/dibenzoyl peroxide and 3,3'-carbonylbis(7-diethylamine coumarin)/N-phenylglycine.

Preferably, the thermal polymerization inhibitor is one or more of tris(N-nitroso-N-phenylhydroxylamine) aluminum salt, p-tert-butylphenol and p-benzoquinone.

Preferably, the inert component has a refractive index of more than 1.5, and is one or more of nematic liquid crystal, nano zinc sulfide, nano silicon dioxide, nano zirconium oxide and nano titanium dioxide; and the nematic liquid crystal is preferably one or more of 5CB, 7CB, 8OCB, P0616A and E7.

According to another aspect of the present invention, there is provided a recording method for the directly printable image recording material, characterized by comprising the following steps:
(1) adding components of the directly printable image recording material of any one of claims 1-7 to a dark reactor, and subjecting them to ultrasonic mixing or stirring mixing to obtain a uniformly mixed solution;
(2) uniformly coating the mixed solution obtained in the step (1) on a flexible film to obtain an image recording material supported by the flexible film;
(3) equally dividing a beam of laser light into two beams of coherent light with equal light intensity, expanding them to form an interference pattern, and placing the image recording material in the step (2) in the interference pattern for holographic exposure to obtain a holographic image; and
(4) subjecting the holographic image obtained in the step (3) to ultraviolet light post-curing.

Preferably, the mixing time in the step (1) is 5 to 200 minutes.

Preferably, the flexible film is one selected from the group consisting of a polyethylene terephthalate film, a polyvinyl chloride film, a polycarbonate film, a polyethylene film and a polypropylene film.

Preferably, the flexible film has a light transmittance of more than 70%.

Further preferably, the flexible film preferably has a light transmittance of more than 80%.

Preferably, a wavelength of the laser light in the step (3) is one of 365 nm, 405 nm, 442 nm, 460 nm and 532 nm.

Preferably, in the holographic exposure in the step (3), the exposure light intensity is 0.5 to 50 mW/cm$^2$; and the exposure time is 5 to 200 seconds.

Preferably, in the holographic exposure in the step (3), the exposure light intensity is 1 to 40 mW/cm$^2$; and the exposure time is 5 to 150 seconds.

Preferably, in the holographic exposure in the step (3), the exposure light intensity is 3 to 30 mW/cm$^2$; and the exposure time is 20 to 100 seconds.

Preferably, the post-cure time in the step (4) is 50 to 1000 seconds.

Preferably, the post-cure time in the step (4) is 200 to 800 seconds.

In general, by comparing the above technical solution of the present inventive concept with the prior art, the present invention has the following beneficial effects:

(1) in the directly printable image recording material of the present invention, through combining the polyhedral oligomeric silsesquioxane monomer having high viscosity, high rigidity, low thermal conductivity and low refractive index with other photopolymerizable monomer and high refractive index inert component, and adjusting proportions of these components (when the high refractive index inert component is solid nanoparticles, the viscosity of the system is increased, and the introduction of the liquid crystal reduces the viscosity of the system), the image recording material is enabled to have an initial viscosity of 200 to 800 mPa·s, and can be directly coated on a film without the necessity of being packaged in a glass case. Thus, this image recording material is suitable for printing and continuous production, which is simple and easy to operate.

(2) in the image recording material of the present invention, the low thermal conductivity monomer allows reaction heat to be converted into system internal, which accelerates the diffusion of the inert component and promotes phase separation between the formed polymer and the inert component.

(3) in the image recording material of the present invention, by introducing a silicon-based monomer with polyhedral oligomeric silsesquioxane as the silicon core into the photopolymerizable monomer in combination with other material components such as a high refractive index inert component, the recording material is allowed to have an initial viscosity of 200 to 800 mPa·s, and meanwhile, the low thermal conductivity characteristic of the silicon-based monomer with polyhedral oligomeric silsesquioxane as the silicon core is utilized to enable internal heat generated during the reaction to promote the diffusion of the inert component, so that image storage quality is ensured, thereby solving the contradiction that increasing the viscosity of the image recording material enables direct printing, but increasing the viscosity of the system reduces the diffusion rate of molecules and particles in the system, resulting in poor holographic image storage quality.

(4) in the directly printable image recording material of the present invention, at least one silicon-based monomer with polyhedral oligomeric silsesquioxane as the silicon core is introduced in combination with the use of an inert component having a specific refractive index range, and the components are synergistically combined to constitute a an inseparable whole.

(5) the reaction conditions of the recording method in the present invention are insensitive to oxygen and water, without harsh application conditions; after coherent laser exposure, a holographic image with excellent storage quality can be obtained, and the diffraction efficiency of the corresponding holographic grating is not less than 90%.

BRIEF DESCRIPTION OF THE DRAWINGS

FIG. 1 is a graph showing a relationship between the viscosity and the content of a silicon-based monomer of a directly printable image recording material prepared in the present invention.

DETAILED DESCRIPTION OF THE EMBODIMENTS

For clear understanding of the objectives, features and advantages of the present invention, detailed description of the present invention will be given below in conjunction with accompanying drawings and specific embodiments. It should be noted that the embodiments described herein are only meant to explain the present invention, and not to limit the scope of the present invention. Furthermore, the technical features related to the embodiments of the invention described below can be mutually combined if they are not found to be mutually exclusive.

The present invention provides a directly printable image recording material comprising 25 to 78.8 parts by mass of a photopolymerizable monomer, 0.2 to 5 parts by mass of a photoinitiator, 20 to 70 parts by mass of an inert component, and 0.05 to 2 parts by mass of a thermal polymerization inhibitor, the image recording material having an initial viscosity of 200 to 800 mPa·s, wherein:

The photopolymerizable monomer includes a thiol monomer and an olefin monomer, and a molar ratio of the thiol functional group to the olefin functional group in the photopolymerizable monomer is 1:10 to 10:1, preferably 1:5 to 5:1, further preferably 1:3 to 3:1. At least one of the thiol monomer and the olefin monomer is a silicon-based monomer with polyhedral oligomeric silsesquioxane (POSS) as a silicon core, and a mole percentage of the silicon-based monomer in the photopolymerizable monomer is not less than 10%.

The silicon-based monomer has a structure as shown in the formula (1):

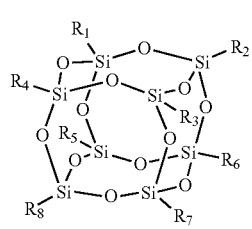

Formula (1)

When the thiol monomer is a silicon-based thiol monomer shown in the formula (1), outer organic functional groups $R_1, R_2 \ldots R_8$ are each independently $C_aH_{2a+1}$ or $C_bH_{2b}SH$, and at least one organic functional group is $C_bH_{2b}SH$, where a represents an integer of 0 to 9, and b represents an integer of 1 to 9.

When the olefin monomer is a silicon-based olefin monomer shown in the formula (1), outer organic functional groups $R_1, R_2 \ldots R_8$ are each independently $C_cH_{2c+1}$ or $C_dH_{2d}$—$C_2H_4$, and at least one organic functional group is $C_dH_{2d}$—$C_2H_4$, where c represents an integer of 0 to 9, and d represents an integer of 1 to 7.

When the thiol monomer is not a silicon-based monomer, it may be one or more selected from the group consisting of ethylene glycol di(3-mercaptopropionate), trimethylolpropane tris(3-mercaptopropionate) and pentaerythritol tetrakis (3-mercaptopropionate).

When the olefin monomer is not a silicon-based monomer, it may be one or more selected from the group consisting of trimethylolpropane triacrylate, pentaerythritol tetraacrylate, pentaerythritol triacrylate, hyperbranched acrylate 6361-100, triallyl isocyanurate, pentaerythritol triallyl ether, divinyl sulfone, tetravinylsilane, tetraallylsilane, 2,4,6-trivinyl-2,4,6-trimethylcyclotrisiloxane, and tetramethyltetravinylcyclotetrasiloxane.

FIG. 1 is a graph showing a relationship between the viscosity and the content of the silicon-based monomer of a directly printable image recording material prepared in the present invention, and it can be seen from FIG. 1 that the viscosity of the image recording material gradually increases as the content of the silicon-based monomer increases.

The photoinitiator is one of rose bengal/N-phenylglycine, (2,4,6-trimethoxyphenyl)diphenylphosphine oxide, Irgacure 184/dibenzoyl peroxide, Irgacure 784/dibenzoyl peroxide and 3,3'-carbonylbis(7-diethylamine coumarin)/N-phenylglycine.

The thermal polymerization inhibitor is one of tris(N-nitroso-N-phenylhydroxylamine) aluminum salt, p-tert-butylphenol and p-benzoquinone.

The inert component preferably has a refractive index of more than 1.5, and is one or more of nematic liquid crystal, nano zinc sulfide, nano silicon dioxide, nano zirconium oxide and nano titanium dioxide, in which the nematic liquid crystal is preferably one or more of 5CB, 7CB, 8OCB, P0616A and E7.

A recording method for the above directly printable image recording material includes the following steps:

(1) Components of the directly printable image recording material are added to a dark reactor, and subjected to ultrasonic mixing or stirring mixing at room temperature (20 to 30° C.) with a mixing time of 5 to 200 minutes, thereby obtaining a uniformly mixed solution;

(2) The mixed solution obtained in the step (1) is uniformly coated on a flexible film to obtain an image recording material supported by the flexible film; the flexible film is one selected from the group consisting of a polyethylene terephthalate film, a polyvinyl chloride film, a polycarbonate film, a polyethylene film and a polypropylene film; the flexible film preferably has a light transmittance of more than 70%, and further preferably, the flexible film preferably has a light transmittance of more than 80%.

(3) A beam of laser light is equally divided into two beams of coherent light with equal light intensity, and then expanded to form an interference field, and the image recording material in the step (2) is placed in the interference field for holographic exposure. In bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) is subjected to ultraviolet light post-curing.

A wavelength of the laser light in the step (3) is one of 365 nm, 405 nm, 442 nm, 460 nm and 532 nm. In the holographic exposure, the exposure light intensity is 0.5 to 50 mW/cm², preferably 1 to 40 mW/cm², further preferably 3 to 30 mW/cm²; the exposure time is 5 to 200 seconds, preferably 5 to 150 seconds, further preferably 20 to 100 second.

The post-curing time in the step (4) is 50 to 1000 seconds, preferably 200 to 800 seconds.

As a preferred solution, the directly printable image recording material of the present invention comprises 45 to 75 parts by mass of a photopolymerizable monomer, 0.2 to 3 parts by mass of a photoinitiator, 20 to 50 parts by mass of a high refractive index inert component, and 0.05 to 2 parts by mass of a thermal polymerization inhibitor. If the initial viscosity of the image recording material is excessively large, the material is difficult to print uniformly, and if the viscosity is excessively small, the material may be displaced and difficult to fix. The image recording material in the present invention has an initial viscosity of 200 mPa·s to 800 mPa·s, and can be directly coated on a film without the necessity of being packaged in a glass case. After coherent laser exposure, a holographic image with excellent storage quality can be obtained; the diffraction efficiency of the grating corresponding to the holographic image is not less than 90%. In addition to the type and content of the photopolymerizable monomer and the high refractive index inert component, the diffraction efficiency is related to processing factors such as processing light intensity and exposure time. The processing light intensity is preferably 1 to 40 mW/cm$^2$, further preferably 3 to 30 mW/cm$^2$; and the exposure time is preferably 5 to 150 seconds, further preferably 20 to 100 seconds.

In the present invention, the polyhedral oligomeric silsesquioxane monomer with high viscosity, high rigidity, low thermal conductivity and low refractive index is combined with other photopolymerizable monomer and high refractive index inert component, so that the image recording material has an initial viscosity of not less than 200 mPa·s, and can be directly coated on a film without the necessity of being packaged in a glass case. Thus, this image recording material is suitable for printing and continuous production, which is simple and easy to operate. The possible mechanism is: the low thermal conductivity monomer allows reaction heat to be converted into system internal, which accelerates the diffusion of the inert component and promotes phase separation between the formed polymer and the inert component. Reaction conditions of the recording method in the present invention are insensitive to oxygen and water, without harsh application conditions. After coherent laser exposure, a holographic image with excellent storage quality can be obtained, and the diffraction efficiency of the corresponding holographic grating is not less than 90%.

Embodiments are described as follows.

Embodiment 1

A directly printable image recording material comprises 65 wt. % of a photopolymerizable monomer, 3 wt. % of a photoinitiator, 30 wt. % of a high refractive index inert component, and 2 wt. % of a thermal polymerization inhibitor, and has a viscosity of 382 mPa·s.

The photopolymerizable monomer is a mixture of pentaerythritol tetraacrylate, hyperbranched acrylate 6361-100, thiol monomer with POSS as the core (in the structure of formula (1), $R_1=R_2=R_3=R_4=R_5=R_6=R_7=R_8=C_3H_6SH$) and ethylene glycol di(3-mercaptopropionate) according to a molar ratio of 1:1:1:2, and the molar percentage of the silicon-based monomer is 20%. The photoinitiator is rose bengal/N-phenylglycine, the high refractive index inert component is nematic liquid crystal 8OCB, and the thermal polymerization inhibitor is p-tert-butylphenol.

A recording method for the directly printable image recording material comprises the following steps:

(1) The directly printable image recording material was placed in a dark reactor, and subjected to stirring mixing at room temperature for 5 minutes to obtain a uniformly mixed solution.

(2) The mixed solution obtained in the step (1) was uniformly coated on a polypropylene film.

(3) A beam of laser light of 532 nm was equally divided into two beams of coherent light with a light intensity of 5 mW/cm$^2$, and then expanded to form an interference field, and the film in the step (2) was placed in the interference field for holographic exposure for 30 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 50 seconds, and the diffraction efficiency of the grating corresponding to the holographic image is 86%.

Comparative Example 1

A directly printable image recording material comprises 25 wt. % of a photopolymerizable monomer, 3 wt. % of a photoinitiator, 70 wt. % of a high refractive index inert component, and 2 wt. % of a thermal polymerization inhibitor, and has a viscosity of 221 mPa·s.

The photopolymerizable monomer is a mixture of pentaerythritol tetraacrylate, hyperbranched acrylate 6361-100, thiol monomer with POSS as the core (in the structure of formula (1), $R_1=R_2=R_3=R_4=R_5=R_6=R_7=R_8=C_3H_6SH$) and ethylene glycol di(3-mercaptopropionate) according to a molar ratio of 1:1:1:2, and the molar percentage of the silicon-based monomer is 20%. The photoinitiator is rose bengal/N-phenylglycine, the high refractive index inert component is nematic liquid crystal 8OCB, and the thermal polymerization inhibitor is p-tert-butylphenol.

A recording method for the directly printable image recording material comprises the following steps:

(1) The directly printable image recording material was placed in a dark reactor, and subjected to stirring mixing at room temperature for 5 minutes to obtain a uniformly mixed solution.

(2) The mixed solution obtained in the step (1) was uniformly coated on a polypropylene film.

(3) A beam of laser light of 532 nm was equally divided into two beams of coherent light with a light intensity of 5 mW/cm$^2$, and then expanded to form an interference field, and the film in the step (2) was placed in the interference field for holographic exposure for 30 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. When the laser light carries image information, the image information can be transferred to the image recording material, thereby obtaining a holographic image.

(4) The holographic image obtained in the step (3) was subjected to ultraviolet light post-curing for 50 seconds, and the diffraction efficiency of the grating corresponding to the holographic image is 16%.

Embodiment 1 is different from Comparative Example 1 only in the ratio of the high refractive index inert component to the photopolymerizable monomer, resulting in a great difference in diffraction efficiency of the obtained grating. This indicates that the ratio of the high refractive index inert component to the photopolymerizable monomer has a great influence on the diffraction efficiency of the holographic grating, and when the content of the high refractive index inert component is excessively high, the diffraction efficiency is reduced.

Embodiment 2

A directly printable image recording material comprises 60 wt. % of a photopolymerizable monomer, 1.95 wt. % of a photoinitiator, 38 wt. % of a high refractive index inert component, and 0.05 wt. % of a thermal polymerization inhibitor, and has a viscosity of 454 mPa·s.

The photopolymerizable monomer is a mixture of pentaerythritol triacrylate, pentaerythritol triallyl ether, thiol monomer with POSS as the core (in the structure of formula (1), $R_1=R_2=R_3=R_4=C_5H_{11}$, and $R_5=R_6=R_7=R_8=C_2H_4SH$) and trimethylolpropane tris(3-mercaptopropionate) according to a molar ratio of 3:3:3:2, and the molar percentage of the silicon-based monomer is 27.3%. The photoinitiator is Irgacure 184/dibenzoyl peroxide, the high refractive index inert component is nano zinc sulfide, and the thermal polymerization inhibitor is p-benzoquinone.

A recording method for the directly printable image recording material comprises the following steps:

(1) The directly printable image recording material was placed in a dark reactor, and subjected to ultrasonic mixing at room temperature for 20 minutes to obtain a uniformly mixed solution.

(2) The mixed solution obtained in the step (1) was uniformly coated on a polyethylene terephthalate film.

(3) A beam of laser light of 365 nm was equally divided into two beams of coherent light with a light intensity of 20 mW/cm², and then expanded to form an interference field, and the film in the step (2) was placed in the interference field for holographic exposure for 100 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 300 seconds, and the diffraction efficiency of the grating corresponding to the holographic image is 89%.

Comparative Example 2

A directly printable image recording material comprises 60 wt. % of a photopolymerizable monomer, 1.95 wt. % of a photoinitiator, 38 wt. % of a high refractive index inert component, and 0.05 wt. % of a thermal polymerization inhibitor, and has a viscosity of 245 mPa·s.

The photopolymerizable monomer is a mixture of pentaerythritol triacrylate and pentaerythritol tetrakis(3-mercaptopropionate) according to a molar ratio of 1:1, and the molar percentage of the silicon-based monomer is 0. The photoinitiator is Irgacure 184/dibenzoyl peroxide, the high refractive index inert component is nano zinc sulfide, and the thermal polymerization inhibitor is p-benzoquinone.

A recording method for the directly printable image recording material comprises the following steps:

(1) The directly printable image recording material was placed in a dark reactor, and subjected to gultrasonic mixing at room temperature for 20 minutes to obtain a uniformly mixed solution.

(2) The mixed solution obtained in the step (1) was uniformly coated on a polyethylene terephthalate film.

(3) A beam of laser light of 365 nm was equally divided into two beams of coherent light with a light intensity of 20 mW/cm², and then expanded to form an interference field, and the film in the step (2) was placed in the interference field for holographic exposure for 100 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 300 seconds, and the diffraction efficiency of the grating corresponding to the holographic image is 0.

Embodiment 2 is different from Comparative Example 2 only in that no silicon-based monomer is included in Comparative Example 2. This indicates that the introduction of the silicon-based monomer can significantly improve the diffraction efficiency of the holographic grating.

Embodiment 3

A directly printable image recording material comprises 69.3 wt. % of a photopolymerizable monomer, 0.6 wt. % of a photoinitiator, 30 wt. % of a high refractive index inert component, and 0.1 wt. % of a thermal polymerization inhibitor, and has a viscosity of 598 mPa·s.

The photopolymerizable monomer is a mixture of triallyl isocyanurate and thiol monomer with POSS as the core (in the structure of formula (1), $R_1=R_2=R_3=R_4=C_3H_7$, and $R_5$=$R_6$=$R_7$=$R_8$=$C_3H_6SH$) according to a molar ratio of 4:3, and the molar percentage of the silicon-based monomer is 57.2%. The photoinitiator is 3,3'-carbonylbis(7-diethylamine coumarin)/N-phenylglycine, the high refractive index inert component is nematic liquid crystal P0616A, and the thermal polymerization inhibitor is tris(N-nitroso-N-phenylhydroxylamine) aluminum salt.

A recording method for the directly printable image recording material comprises the following steps:

(1) The directly printable image recording material was placed in a dark reactor, and subjected to stirring mixing at room temperature for 50 minutes to obtain a uniformly mixed solution.

(2) The mixed solution obtained in the step (1) was uniformly coated on a polyethylene terephthalate film.

(3) A beam of laser light of 442 nm was equally divided into two beams of coherent light with a light intensity of 3 mW/cm², and then expanded to form an interference field, and the film in the step (2) was placed in the interference field for holographic exposure for 30 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 600 seconds, and the diffraction efficiency of the grating corresponding to the holographic image is 94%.

Comparative Embodiment 3

A directly printable image recording material comprises 69.3 wt. % of a photopolymerizable monomer, 0.6 wt. % of a photoinitiator, 30 wt. % of a high refractive index inert component, and 0.1 wt. % of a thermal polymerization inhibitor, and has a viscosity of 598 mPa·s.

The photopolymerizable monomer is a mixture of triallyl isocyanurate and thiol monomer with POSS as the core (in the structure of formula (1), $R_1$=$R_2$=$R_3$=$R_4$=$C_3H_7$, and $R_5$=$R_6$=$R_7$=$R_8$=$C_3H_6SH$) according to a molar ratio of 4:3, and the molar percentage of the silicon-based monomer is 57.2%. The photoinitiator is 3,3'-carbonylbis(7-diethylamine coumarin)/N-phenylglycine, the high refractive index inert component is nematic liquid crystal P0616A, and the thermal polymerization inhibitor is tris(N-nitroso-N-phenylhydroxylamine) aluminum salt.

A recording method for the directly printable image recording material comprises the following steps:

(1) The directly printable image recording material was placed in a dark reactor, and subjected to stirring mixing at room temperature for 50 minutes to obtain a uniformly mixed solution.

(2) The mixed solution obtained in the step (1) was uniformly coated on a polyethylene terephthalate film.

(3) A beam of laser light of 442 nm was equally divided into two beams of coherent light with a light intensity of 0.5 mW/cm², and then expanded to form an interference field, and the film in the step (2) was placed in the interference field for holographic exposure for 5 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 600 seconds, and the diffraction efficiency of the grating corresponding to the holographic image is 14%.

Embodiment 3 is different from Comparative Example 3 only in exposure conditions, resulting in a large difference in diffraction efficiency of the grating. This indicates that the exposure conditions have a large influence on the diffraction efficiency of the holographic grating, and when the exposure light intensity is excessively low and the exposure time is excessively short, it is difficult to form an ordered grating structure and the diffraction efficiency is poor.

Embodiment 4

A directly printable image recording material comprises 78.8 wt. % of a photopolymerizable monomer, 1 wt. % of a photoinitiator, 20 wt. % of a high refractive index inert component, and 0.2 wt. % of a thermal polymerization inhibitor, and has a viscosity of 614 mPa·s.

The photopolymerizable monomer is a mixture of pentaerythritol tetrakis(3-mercaptopropionate), thiol monomer with POSS as the core (in the structure of formula (1), $R_1$=$R_2$=$R_3$=$R_4$=$R_5$=$R_6$=$R_7$=$R_8$=$C_2H_4$—$C_2H_4$) and trimethylolpropane triacrylate according to a molar ratio of 5:1:4, and the molar percentage of the silicon-based monomer is 10%. The photoinitiator is Irgacure 784/dibenzoyl peroxide, the high refractive index inert component is nano titanium dioxide, and the thermal polymerization inhibitor is p-benzoquinone.

A recording method for the directly printable image recording material comprises the following steps:

(1) The directly printable image recording material was placed in a dark reactor, and subjected to stirring mixing at room temperature for 200 minutes to obtain a uniformly mixed solution.

(2) The mixed solution obtained in the step (1) was uniformly coated on a polycarbonate film.

(3) A beam of laser light of 532 nm was equally divided into two beams of coherent light with a light intensity of 10 mW/cm², and then expanded to form an interference field, and the film in the step (2) was placed in the interference field for holographic exposure for 10 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 600 seconds, and the diffraction efficiency of the grating corresponding to the holographic image is 84%.

Embodiment 5

A directly printable image recording material comprises 54 wt. % of a photopolymerizable monomer, 5 wt. % of a photoinitiator, 40 wt. % of a high refractive index inert component, and 1 wt. % of a thermal polymerization inhibitor, and has a viscosity of 559 mPa·s.

The photopolymerizable monomer is a mixture of pentaerythritol tetrakis(3-mercaptopropionate) and thiol monomer with POSS as the core (in the structure of formula (1), $R_1=R_2=R_3=R_4=R_5=R_6=R_7=R_8=C_2H_4$) according to a molar ratio of 8:3, and the molar percentage of the silicon-based monomer is 27.3%. The photoinitiator is (2,4, 6-trimethoxyphenyl)diphenylphosphine oxide, the high refractive index inert component is nano zirconium oxide, and the thermal polymerization inhibitor is tris(N-nitroso-N-phenylhydroxylamine) aluminum salt.

A recording method for the directly printable image recording material comprises the following steps:

(1) The directly printable image recording material was placed in a dark reactor, and subjected to stirring mixing at room temperature for 100 minutes to obtain a uniformly mixed solution.

(2) The mixed solution obtained in the step (1) was uniformly coated on a polyethylene film.

(3) A beam of laser light of 405 nm was equally divided into two beams of coherent light with a light intensity of 50 mW/cm$^2$, and then expanded to form an interference field, and the film in the step (2) was placed in the interference field for holographic exposure for 200 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 1000 seconds, and the diffraction efficiency of the grating corresponding to the holographic image is 74%.

Embodiment 6

A directly printable image recording material comprises 60 wt. % of a photopolymerizable monomer, 0.2 wt. % of a photoinitiator, 38.5 wt. % of a high refractive index inert component, and 1.3 wt. % of a thermal polymerization inhibitor, and has a viscosity of 538 mPa·s.

The photopolymerizable monomer is a mixture of divinyl sulfone and thiol monomer with POSS as the core (in the structure of formula (1), $R_1=R_2=R_3=R_4=C_5H_{11}$, and $R_5=R_6=R_7=R_8=C_2H_4SH$) according to a molar ratio of 4:1, and the molar percentage of the silicon-based monomer is 20%. The photoinitiator is 3,3'-carbonylbis(7-diethylamine coumarin)/N-phenylglycine, the high refractive index inert component is 18.5 wt. % of liquid crystal E7 and 20 wt. % of nano Zinc sulfide, and the thermal polymerization inhibitor is p-tert-butylphenol.

A recording method for the directly printable image recording material comprises the following steps:

(1) The directly printable image recording material was placed in a dark reactor, and subjected to stirring mixing at room temperature for 50 minutes to obtain a uniformly mixed solution.

(2) The mixed solution obtained in the step (1) was uniformly coated on a polyvinyl chloride film.

(3) A beam of laser light of 442 nm was equally divided into two beams of coherent light with a light intensity of 5 mW/cm$^2$, and then expanded to form an interference field, and the film in the step (2) was placed in the interference field for holographic exposure for 20 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 600 seconds, and the diffraction efficiency of the grating corresponding to the holographic image is 92%.

Embodiment 7

A directly printable image recording material comprises 70 wt. % of a photopolymerizable monomer, 3 wt. % of a photoinitiator, 25 wt. % of a high refractive index inert component, and 2 wt. % of a thermal polymerization inhibitor, and has a viscosity of 621 mPa·s.

The photopolymerizable monomer is a mixture of ethylene glycol di(3-mercaptopropionate) and thiol monomer with POSS as the core (in the structure of formula (1), $R_1=R_2=R_3=R_4=C_2H_4-C_2H_4$, and $R_5=R_6=R_7=R_8=CH_3$) according to a molar ratio of 2:1, and the molar percentage of the silicon-based monomer is 33.3%. The photoinitiator is Irgacure 184/dibenzoyl peroxide, the high refractive index inert component is nano Zinc sulfide, and the thermal polymerization inhibitor is p-benzoquinone.

A recording method for the directly printable image recording material comprises the following steps:

(1) The directly printable image recording material was placed in a dark reactor, and subjected to stirring mixing at room temperature for 50 minutes to obtain a uniformly mixed solution.

(2) The mixed solution obtained in the step (1) was uniformly coated on a polyvinyl chloride film.

(3) A beam of laser light of 460 nm was equally divided into two beams of coherent light with a light intensity of 10 mW/cm$^2$, and then expanded to form an interference field, and the film in the step (2) was placed in the interference field for holographic exposure for 60 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 600 seconds, and the diffraction efficiency of the grating corresponding to the holographic image is 82%.

Embodiment 8

A directly printable image recording material comprises 45 wt. % of a photopolymerizable monomer, 1.8 wt. % of a photoinitiator, 53.2 wt. % of a high refractive index inert component, and 0.5 wt. % of a thermal polymerization inhibitor, and has a viscosity of 503 mPa·s.

The photopolymerizable monomer is a mixture of pentaerythritol tetrakis(3-mercaptopropionate), tetravinylsilane and thiol monomer with POSS as the core (in the structure of formula (1), $R_1=R_2=R_3=R_4=R_5=R_6=R_7=$OH, and $R_8=C_9H_{18}$SH) according to a molar ratio of 1:1:1, and the molar percentage of the silicon-based monomer is 66.6%. The photoinitiator is 3,3'-carbonylbis(7-diethylamine coumarin)/N-phenylglycine, the high refractive index inert component is nano silicon dioxide, and the thermal polymerization inhibitor is tris(N-nitroso-N-phenylhydroxylamine) aluminum salt.

A recording method for the directly printable image recording material comprises the following steps:

(1) The directly printable image recording material was placed in a dark reactor, and subjected to ultrasonic mixing at room temperature for 100 minutes to obtain a uniformly mixed solution.

(2) The mixed solution obtained in the step (1) was uniformly coated on a polyvinyl chloride film.

(3) A beam of laser light of 460 nm was equally divided into two beams of coherent light with a light intensity of 2 mW/cm$^2$, and then expanded to form an interference field, and the film in the step (2) was placed in the interference field for holographic exposure for 100 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 200 seconds, and the diffraction efficiency of the grating corresponding to the holographic image is 85%.

Embodiment 9

A directly printable image recording material comprises 75 wt. % of a photopolymerizable monomer, 0.7 wt. % of a photoinitiator, 24.1 wt. % of a high refractive index inert component, and 0.2 wt. % of a thermal polymerization inhibitor, and has a viscosity of 416 mPa·s.

The photopolymerizable monomer is a mixture of trimethylolpropane tris(3-mercaptopropionate), 2,4,6-trivinyl-2,4,6-trimethylcyclotrisiloxane and thiol monomer with POSS as the core (in the structure of formula (1), $R_1=R_2=R_3=R_4=R_5=R_6=R_7=$OH, and $R_8=C_9H_{18}$SH) according to a molar ratio of 3:2:3, and the molar percentage of the silicon-based monomer is 62.5%. The photoinitiator is 3,3'-carbonylbis(7-diethylamine coumarin)/N-phenylglycine, the high refractive index inert component is nematic liquid crystals 5CB and 7CB, and the thermal polymerization inhibitor is p-tert-butylphenol.

A recording method for the directly printable image recording material comprises the following steps:

(1) The directly printable image recording material was placed in a dark reactor, and subjected to stirring mixing at room temperature for 200 minutes to obtain a uniformly mixed solution.

(2) The mixed solution obtained in the step (1) was uniformly coated on a polyvinyl chloride film.

(3) A beam of laser light of 442 nm was equally divided into two beams of coherent light with a light intensity of 30 mW/cm$^2$, and then expanded to form an interference field, and the film in the step (2) was placed in the interference field for holographic exposure for 20 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 500 seconds, and the diffraction efficiency of the grating corresponding to the holographic image is 80%.

Embodiment 10

A directly printable image recording material comprises 65 wt. % of a photopolymerizable monomer, 0.4 wt. % of a photoinitiator, 34.6 wt. % of a high refractive index inert component, and 0.5 wt. % of a thermal polymerization inhibitor, and has a viscosity of 346 mPa·s.

The photopolymerizable monomer is a mixture of thiol monomer with POSS as the core (in the structure of formula (1), $R_1=R_2=R_3=R_4=C_5H_{11}O$, and $R_5=R_6=R_7=R_8=C_7H_{14}SH$) and tetraallylsilane according to a molar ratio of 1:4, and the molar percentage of the silicon-based monomer is 100%. The photoinitiator is 3,3'-carbonylbis(7-diethylamine coumarin)/N-phenylglycine, the high refractive index inert component is nematic liquid crystal 5CB, and the thermal polymerization inhibitor is p-benzoquinone.

A recording method for the directly printable image recording material comprises the following steps:

(1) The directly printable image recording material was placed in a dark reactor, and subjected to ultrasonic mixing at room temperature for 30 minutes to obtain a uniformly mixed solution.

(2) The mixed solution obtained in the step (1) was uniformly coated on a polyvinyl chloride film.

(3) A beam of laser light of 460 nm was equally divided into two beams of coherent light with a light intensity of 5 mW/cm$^2$, and then expanded to form an interference field, and the film in the step (2) was placed in the interference field for holographic exposure for 25 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 800 seconds, and the diffraction efficiency of the grating corresponding to the holographic image is 82%.

Embodiment 11

A directly printable image recording material comprises 54.4 wt. % of a photopolymerizable monomer, 0.3 wt. % of a photoinitiator, 44.7 wt. % of a high refractive index inert component, and 0.6 wt. % of a thermal polymerization inhibitor, and has a viscosity of 317 mPa·s.

The photopolymerizable monomer is a mixture of tetramethyltetravinylcyclotetrasiloxane and thiol monomer with POSS as the core (in the structure of formula (1), $R_1=R_2=R_3=R_4=C_3H_7O$, and $R_5=R_6=R_7=R_8=C_3H_6SH$) according to a molar ratio of 4:1, and the molar percentage of the silicon-based monomer is 100%. The photoinitiator is (2,4,6-trimethoxyphenyl)diphenylphosphine oxide, the high refractive index inert component is nematic liquid crystal E7, and the thermal polymerization inhibitor is tris(N-nitroso-N-phenylhydroxylamine) aluminum salt.

A recording method for the directly printable image recording material comprises the following steps:

(1) The directly printable image recording material was placed in a dark reactor, and subjected to ultrasonic mixing at room temperature for 50 minutes to obtain a uniformly mixed solution.

(2) The mixed solution obtained in the step (1) was uniformly coated on a polyvinyl chloride film.

(3) A beam of laser light of 405 nm was equally divided into two beams of coherent light with a light intensity of 4 mW/cm$^2$, and then expanded to form an interference field, and the film in the step (2) was placed in the interference field for holographic exposure for 40 seconds to form an interference pattern; in bright regions of the interference field, the photoinitiator absorbs photons to form free radicals, and then initiates polymerization of the photopolymerizable monomers, resulting in that the monomers in the bright regions are consumed and the monomers in dark regions of the interference field diffuse to the bright regions to participate in the polymerization reaction; meanwhile, due to the change in the chemical potential, the inert component in the bright regions of the interference field diffuses into the dark regions, thereby forming a microstructure in which polymer-rich regions and inert component-rich regions are periodically arranged. In this case, when the laser light carries image information, the image information can be transferred to the image recording material, thereby obtaining a holographic image.

(4) The holographic image obtained in the step (3) was subjected to ultraviolet light post-curing for 300 seconds, and the diffraction efficiency of the grating corresponding to the holographic image is 76%.

It should be readily understood to those skilled in the art that the above description is only preferred embodiments of the present invention, and does not limit the scope of the present invention. Any change, equivalent substitution and modification made without departing from the spirit and scope of the present invention should be included within the scope of the protection of the present invention.

What is claimed is:

1. A directly printable image recording material, comprising:

25 to 78.8 parts by mass of a photopolymerizable monomer;

0.2 to 5 parts by mass of a photoinitiator;

20 to 70 parts by mass of an inert component; and 0.05 to 2 parts by mass of a thermal polymerization inhibitor, wherein the image recording material has an initial viscosity of 200 to 800 mPa·s, the photopolymerizable monomer includes a thiol monomer and an olefin monomer, a molar ratio of a thiol functional group of the thiol monomer to an olefin functional group of the olefin monomer in the photopolymerizable monomer is 1:10 to 10:1, at least one of the thiol monomer and the olefin monomer is a silicon-based monomer with polyhedral oligomeric silsesquioxane as a silicon core, and the silicon-based monomer in the photopolymerizable monomer has a mole percentage of not less than 10%.

2. The directly printable image recording material of claim 1, wherein the silicon-based monomer has a structure as shown in formula (1):

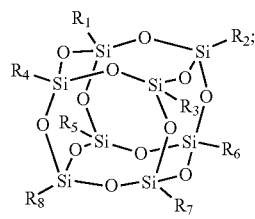

Formula (1)

when the thiol monomer is a silicon-based thiol monomer shown in the formula (1), outer organic functional groups $R_1$ to $R_8$ are each independently $C_aH_{2a+1}$ or $C_bH_{2b}SH$, and at least one outer organic functional group is $C_bH_{2b}SH$, where a represents an integer of 0 to 9, and b represents an integer of 1 to 9;

when the olefin monomer is a silicon-based olefin monomer shown in the formula (1), the outer organic functional groups $R_1$ to $R_8$ are each independently $C_cH_{2c+1}$ or $C_dH_{2d}$—$C_2H_4$, and at least one outer organic functional group is $C_dH_{2d}$—$C_2H_4$, where c represents an integer of 0 to 9, and d represents an integer of 1 to 7.

3. The directly printable image recording material of claim 1, wherein, when the thiol monomer is not a silicon-based monomer, the thiol monomer is one or more of ethylene glycol di(3-mercaptopropionate), trimethylolpropane tris(3-mercaptopropionate) and pentaerythritol tetrakis (3-mercaptopropionate).

4. The directly printable image recording material of claim 1, wherein, when the olefin monomer is not a silicon-based monomer, the olefin monomer is one or more of trimethylolpropane triacrylate, pentaerythritol tetraacrylate, pentaerythritol triacrylate, hyperbranched acrylate 6361-100, triallyl isocyanurate, pentaerythritol triallyl ether, divinyl sulfone, tetravinylsilane, tetraallylsilane, 2,4,6-trivinyl-2,4,6-trimethylcyclotrisiloxane, and tetramethyltetravinylcyclotetrasiloxane.

5. The directly printable image recording material of claim 1, wherein the photoinitiator is one or more of rose bengal/N-phenylglycine, 2,4,6-trimethoxyphenyldiphenylphosphine oxide, Irgacure 184/dibenzoyl peroxide, Irgacure 784/dibenzoyl peroxide, and 3,3'-carbonylbis 7-diethylaminocoumarin)/N-phenylglycine.

6. The directly printable image recording material of claim 1, wherein the thermal polymerization inhibitor is one or more of N-nitroso-N-phenylhydroxylamine aluminum salt, p-tert-butylphenol, and p-benzoquinone.

7. The directly printable image recording material of claim 1, wherein the inert component has a refractive index of more than 1.5, and is one or more of nematic liquid crystal, nano zinc sulfide, nano silicon dioxide, nano zirconium oxide, and nano titanium dioxide.

8. The directly printable image recording material of claim 7, wherein the nematic liquid crystal comprises one or more of 5CB, 7CB, 8OCB, P0616A, and E7.

9. A recording method for the directly printable image recording material of claim 1, comprising the following steps:
(1) adding the directly printable image recording material of claim 1 to a reactor, and ultrasonic mixing or stirring mixing to obtain a uniformly mixed solution;
(2) uniformly coating the mixed solution obtained in the step (1) on a flexible film to obtain an image recording material supported by the flexible film;
(3) equally dividing a beam of laser light into two beams of coherent light with equal light intensity, expanding them to form an interference field, and placing the image recording material in the step (2) in the interference field for holographic exposure to obtain a holographic image; and
(4) subjecting the holographic image obtained in the step (3) to ultraviolet light post-curing.

10. The recording method of claim 9, wherein a wavelength of the laser light in the step (3) is one of 365 nm, 405 nm, 442 nm, 460 nm, and 532 nm.

11. The recording method of claim 9, wherein the holographic exposure in the step (3) is conducted under an exposure light intensity of 0.5 to 50 mW/cm$^2$ with an exposure time of 5 to 200 seconds.

12. The directly printable recording method of claim 11, wherein the holographic exposure is conducted under the exposure light intensity of 1 to 40 mW/cm$^2$.

13. The directly printable recording method of claim 11, wherein the holographic exposure is conducted with the exposure time of 5 to 150 seconds.

* * * * *